(12) United States Patent
Chang

(10) Patent No.: US 7,528,020 B2
(45) Date of Patent: May 5, 2009

(54) METHOD FOR FORMING THIN FILM TRANSISTOR

(75) Inventor: Hsi-Ming Chang, Taoyuan County (TW)

(73) Assignee: Chungwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 11/741,777

(22) Filed: Apr. 30, 2007

(65) Prior Publication Data

US 2007/0238230 A1 Oct. 11, 2007

Related U.S. Application Data

(62) Division of application No. 11/163,933, filed on Nov. 4, 2005, now abandoned.

(51) Int. Cl.
*H01L 21/00* (2006.01)
(52) U.S. Cl. .................. 438/149; 438/157; 438/164; 257/E27.001; 257/E27.13
(58) Field of Classification Search ............... 438/149, 438/157, 164
See application file for complete search history.

(56) References Cited

U.S. PATENT DOCUMENTS 6,369,410 B1 * 4/2002 Yamazaki et al. ............. 257/72
6,852,577 B2 * 2/2005 Chen .......................... 438/163
7,132,317 B2 * 11/2006 Arao .......................... 438/154
2002/0179908 A1 12/2002 Arao

FOREIGN PATENT DOCUMENTS

CN 1585088 2/2005
JP 11-274559 10/1999

* cited by examiner

*Primary Examiner*—Hsien-ming Lee
(74) *Attorney, Agent, or Firm*—Jianq Chyun IP Office

(57) ABSTRACT

A method for forming a pattern is provided. First, a substrate is provided. Then, a discontinuous film is formed on the substrate so as to reduce the stress of the film. After that, the discontinuous film is patterned to form a pattern. Besides, a method for manufacturing a thin film transistor (TFT) is also provided. First, a substrate is provided. Then, a poly silicon island is formed on the substrate. After that, a gate insulating layer is formed to cover the poly silicon island. Then, a gate is formed on the gate insulating layer. After that, a source/drain is formed in the poly silicon island below one side and the other side of the gate respectively, and a channel layer is formed between the source/drain. At least one of the poly silicon island and the gate is formed according to the above mentioned method for forming the pattern.

5 Claims, 12 Drawing Sheets

METHOD FOR FORMING THIN FILM TRANSISTOR

CROSS-REFERENCE TO RELATED APPLICATION

This application is a divisional of a prior application Ser. No. 11/163,933, filed Nov. 4, 2005, now abandoned. The entirety of the above-mentioned patent application is hereby incorporated by reference herein and made a part of this specification.

BACKGROUND OF THE INVENTION

1. Field of the Invention

The present invention generally relates to a method for forming a pattern. More particularly, the present invention relates to a method for forming a pattern capable of reducing the stress of a film, and a method for forming a thin film transistor using said method.

2. Description of Related Art

The display apparatus is the communication interface between user and information media. Currently, the flat panel display is the trend in development. The flat panel display mainly includes organic electro-luminescence display (OELD), plasma display panel (PDP), thin film transistor liquid-crystal display (TFT-LCD) and so on. The TFT-LCD is in widespread use.

The TFT-LCD is composed of a thin film transistor (TFT) array substrate, a color filter (CF) array substrate and a liquid crystal (LC) layer. The TFT array substrate comprises a plurality of pixel units arranged in an array. Each pixel unit is composed of a thin film transistor (TFT), data lines, scan lines and a pixel electrode. The data lines, scan lines and the pixel electrode are electrically connected to the thin film transistor. The above mentioned thin film transistor, which serves as a switch device of the pixel unit, comprises a gate, a channel layer, and a source/drain.

In the conventional fabrication process of the thin film transistor, the film fabrication process, the photolithography process, the etching process and so on are used to form the above mentioned gate, channel layer, source/drain. The presence of uneven stress would occur in each film. Especially, the uneven stress would occur between different layers, which have the large difference in thermal expansion coefficient, after a high temperature process, and therefore the substrate is severely warped. It means that the adhesion between the film and the substrate, or between different films is poor, such that the film would peel. Besides, during the photolithography process, the misalignment and exposure shifting would occur due to the warped substrate.

It should be noted that with the development of the large-sized LCD, the fabrication process of large-sized films becomes more and more important. However, the problem caused by the uneven stress between the films becomes more and more serious with the increased size of the film, and therefore the development of the large-sized LCD TV would be limited.

SUMMARY OF THE INVENTION

A main purpose of the present invention is to provide a method for forming a pattern suitable for reducing the stress of a film and forming the pattern under the condition of a large-sized film.

A second purpose of the present invention is to provide a method for forming a thin film transistor. The method utilizes the above mentioned to reduce the stress of the film and improve the yield rate of the thin film transistor.

As embodied and broadly described herein, the present invention provides a method for forming a pattern. First, a substrate is provided. After that, a discontinuous film is formed on the substrate to reduce the stress of the film. Finally, the discontinuous film is patterned to form a pattern.

According to one embodiment of the present invention, the discontinuous film is formed by a deposition process with a shadow mask.

According to one embodiment of the present invention, the method of forming the discontinuous film on the substrate comprises the following steps. First, a patterned bottom layer is formed on the substrate. Then, a deposition process is performed to form the discontinuous film on the substrate. The patterned bottom layer comprises a plurality of protrusive patterns or a plurality of concave patterns for example. In an embodiment, the top of the protrusive patterns is wider than the bottom thereof. In another embodiment, the top of the concave patterns is narrower than the bottom thereof.

According to one embodiment of the present invention, the discontinuous film is patterned by a photolithography process and an etching process.

As embodied and broadly described herein, the present invention provides a method for forming a thin film transistor. First, a substrate is provided. Then, a poly silicon island is formed on the substrate. Next, a gate insulating layer is formed to cover the poly silicon island. After that, a gate is formed on the gate insulating layer. Then, a source/drain is formed in the poly silicon island below one side and the other side of the gate, in which a channel layer is formed between the source and the drain, and at least one of the poly silicon island and the gate is formed by the above mention method for forming a pattern.

According to one embodiment of the present invention, the method for forming a thin film transistor further comprises the following steps. First, a patterned dielectric layer is formed on the substrate, in which the patterned dielectric layer exposes a part of the source/drain. After that, a source/drain conducting layer are formed on the patterned dielectric layer, in which the source/drain conducting layer are electrically connected to the source/drain respectively, and at least one of the patterned dielectric layer, the source/drain conducting layer is formed by using the above mention method for forming a pattern.

According to one embodiment of the present invention, the method for forming the patterned dielectric layer further comprises the following steps. First, a dielectric layer is formed on the substrate to cover the gate and the gate insulating layer. Then, a patterned photoresist layer having a first aperture and a second aperture is formed on the dielectric layer. After that, a first etching process is performed to remove the dielectric layer under the first aperture in order to form a concave pattern in the dielectric layer. Next, a second etching process is performed to remove the dielectric layer and the gate insulating layer under the second aperture in order to expose the source/drain and remove the gate insulating layer under the first aperture simultaneously. Then, the patterned photoresist layer is removed.

According to one embodiment of the present invention, the method for forming the patterned photoresist layer comprises performing an exposure process by using a half-tone mask.

According to one embodiment of the present invention, before the second etching process is performed, the method further comprises an ashing process to make the second aperture expose the dielectric layer.

According to one embodiment of the present invention, before the poly silicon island is formed, the method further comprises a step of forming a buffer layer on the substrate, and the buffer layer is a discontinuous film.

According to one embodiment of the present invention, the gate insulating layer is a discontinuous film.

According to one embodiment of the present invention, the method of forming the poly silicon island comprises the following steps. First, an amorphous silicon layer is formed on the substrate, in which the amorphous silicon layer is a discontinuous film. Next, an annealing process is performed to make the amorphous silicon layer transform into a poly silicon layer. After that, the poly silicon layer is patterned to form the poly silicon island.

As embodied and broadly described herein, the present invention provides another method for forming a thin film transistor, First, a gate is formed on a substrate. Next, a gate insulating layer is formed on the substrate to cover the gate. Thereafter, a channel layer is formed on the gate insulating layer and the gate. Then, a source/drain is formed on the channel layer, in which at least one of the gate, the channel layer, the source/drain is formed by using the above mentioned method for forming the pattern.

According to one embodiment of the present invention, before the source/drain are formed, the method further comprises the step of forming an ohmic contact layer on the channel layer, and the ohmic contact layer is formed by the above mentioned method for forming the pattern.

According to one embodiment of the present invention, the gate insulating layer is a discontinuous film for example.

According to one embodiment of the present invention, after the source/drain are formed, the method further comprises a step of forming a passivation layer to cover the source/drain, and the passivation layer is formed by the above mentioned method for forming the pattern.

The invention utilizes the method for forming a pattern of a discontinuous film, to avoid the substrate from being warped due to the uneven stress. The invention can reduce the stress of the films efficiently under the condition of a large-sized film. Besides, the method for forming a pattern of the present invention can be applied to the fabrication process of the thin film transistor in order to improve the yield rate of the thin film transistor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
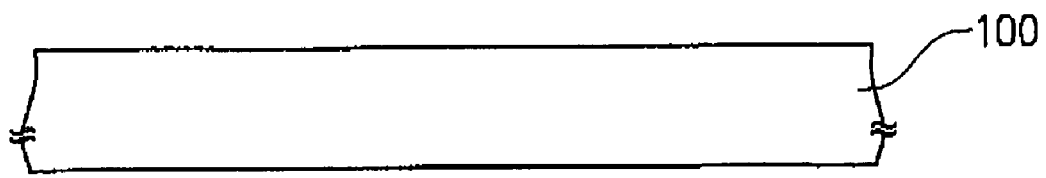
FIGS. 1A to 1C are schematic, cross-sectional diagrams illustrating the process flow for forming a pattern according to a preferred embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 1B:
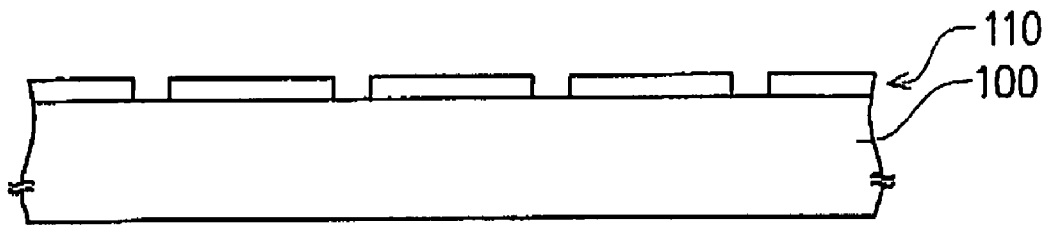
Figure 1C:
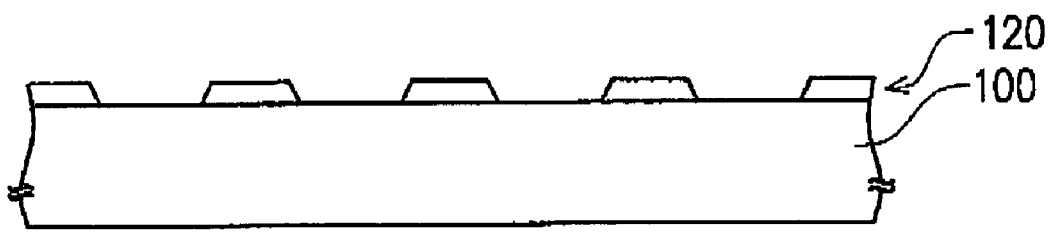

FIGS. 1A to 1C are schematic, cross-sectional diagrams illustrating the process flow for forming a pattern according to a preferred embodiment of the present invention. First, please refer to FIG. 1A, a substrate 100 is provided. Next, please refer to FIG. 1B, a discontinuous film 110 is formed on the substrate 100 to reduce the stress of the film 110. Finally, please refer to FIG. 1C, the discontinuous film 110 is patterned to form a pattern 120.

In an embodiment of the present invention, the method for forming the discontinuous film 110 on the substrate 100 as shown in FIG. 1B comprises a step of performing a deposition process 140 (shown in FIG. 2) by using a shadow mask 130. The deposition process 140 can be a chemical vapor deposition (CVD) process or a physical vapor deposition (PVD) process.

Figure 2:
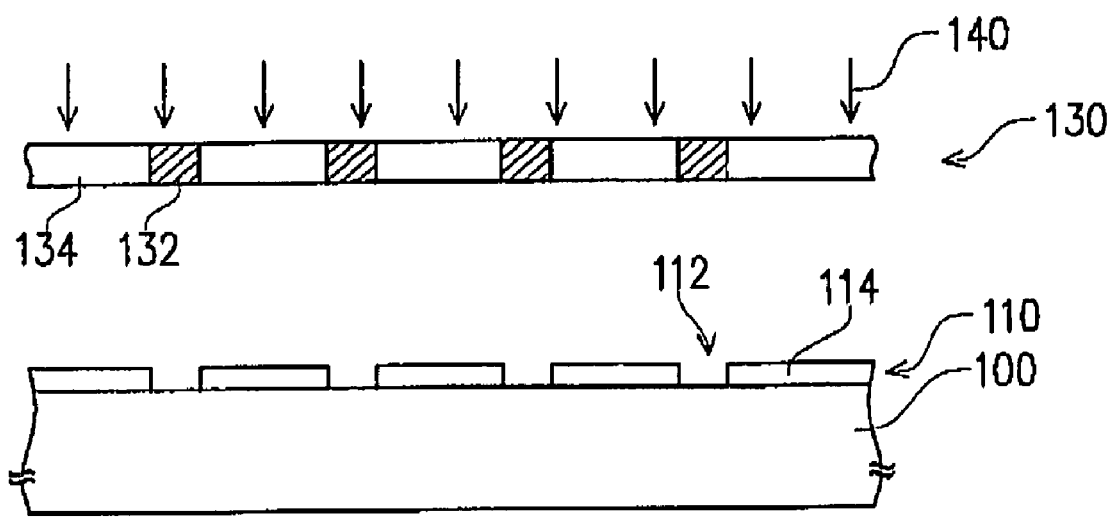
FIG. 2 is a schematic side view showing that a deposition process is performed by using a shadow mask according to a preferred embodiment of the present invention.

FIG. 2 is a schematic side view showing that a deposition process is performed by using a shadow mask according to a preferred embodiment of the present invention. Please refer to FIG. 2, the shadow mask 130 comprises a shadow region 132 and a transmissive region 134 while an ion beam can not pass through the shadow region 132 but can pass through the transmissive region 134 during the deposition process 140. Therefore, the discontinuous film 110 having a discontinuous region 112 and a plurality of blocks 114 is formed on the substrate 100.

Figure 3A:
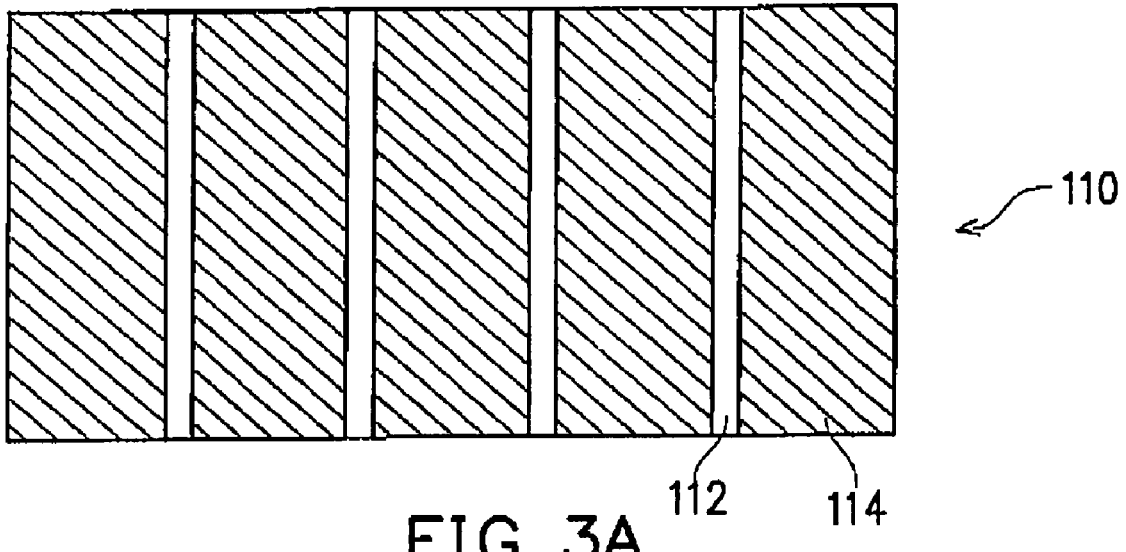
FIGS. 3A and 3B are schematic top views showing the discontinuous films of a grating and a checker board shapes.
Figure 3B:
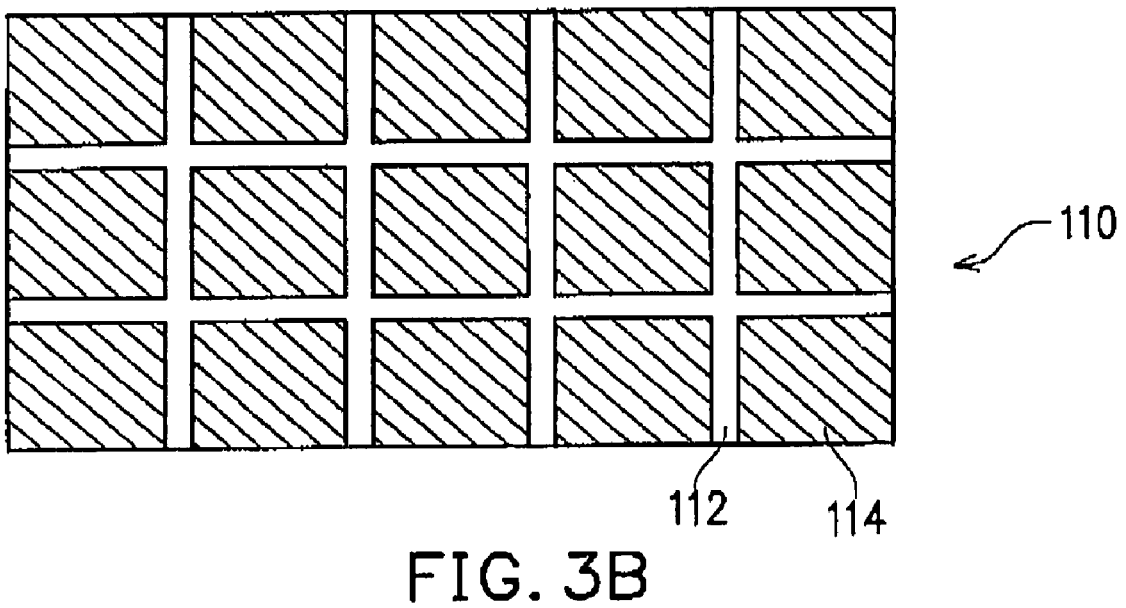

In addition, the arrangement of the shadow region 132 and the transmissive region 134 of the shadow mask 130 can be designed as a grating shape or a checker board shape according to the structure of the device, and then the deposition process 140 is performed to form the discontinuous film 110 of the grating shape or the checker board shape. FIGS. 3A and 3B are schematic top views showing the discontinuous films of a grating shape and a checker board shapes. Please refer to FIG. 3A, the discontinuous film 110 of the grating shape is shown. A plurality of blocks 114 are divided by the discontinuous region 112 and can be patterned to form a scan line, a data line and so on. Please refer to FIG. 3B, the discontinuous film 110 of the checker board shape is shown. A plurality of blocks 114 are divided by the discontinuous region 112 and are adapted for forming the device in each pixel unit such as a pixel electrode, a gate, a source/drain and so on.

Figure 4A:
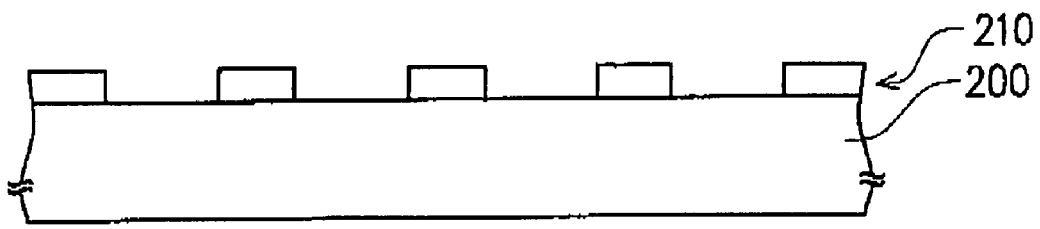
FIGS. 4A and 4B are schematic, cross-sectional diagrams illustrating the process flow for forming the discontinuous films by using a patterned bottom layer according to a preferred embodiment of the present invention.
Figure 4B:
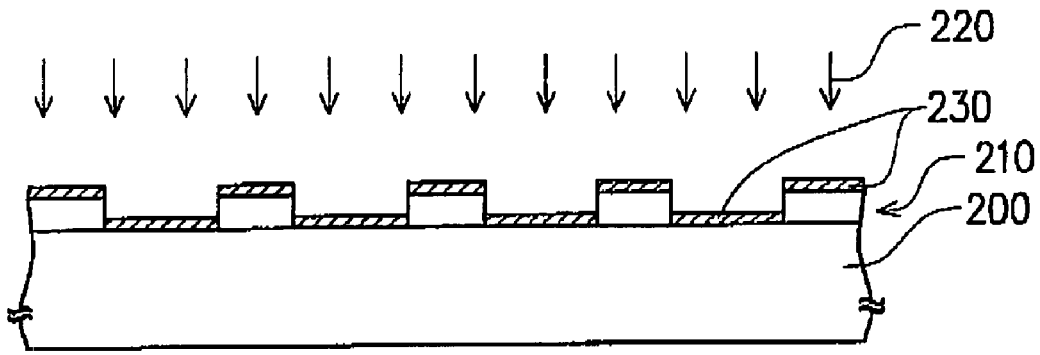

In another embodiment of the present invention, the method of forming the discontinuous film 110 on the substrate 100 shown in FIG. 1B may comprises the steps shown in FIGS. 4A and 4B.

FIGS. 4A and 4B are schematic, cross-sectional diagrams illustrating the process flow for forming the discontinuous films by using a patterned bottom layer according to a preferred embodiment of the present invention. Please refer to FIG. 4A, a patterned bottom layer 210 is formed on the substrate 200. Next, a deposition process 220 is performed to form a discontinuous film 230 on the substrate 200. The patterned bottom layer 210 can be formed by the conventional photolithography process and the etching process, and so it is not repeated herein.

Figure 5A:
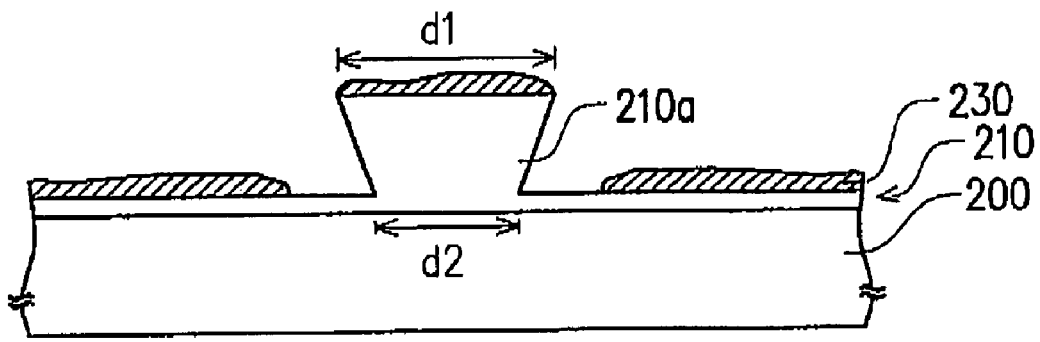
FIGS. 5A and 5B are schematic, cross-sectional diagrams showing the patterned bottom layer.
Figure 5B:
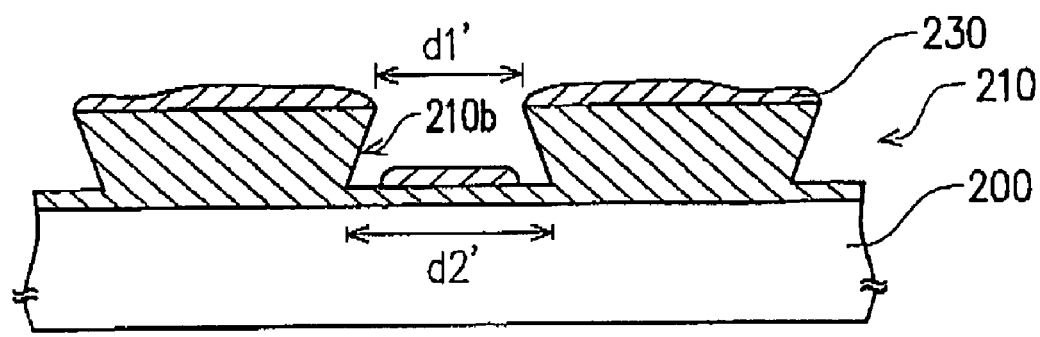

It should be noted that the patterned bottom layer 210 can comprises a plurality of protrusive patterns or a plurality of concave patterns for example. FIGS. 5A and 5B are schematic, cross-sectional diagrams showing the patterned bottom layer. First, please refer to FIG. 5A, the patterned bottom layer 210 can be a protrusive pattern 210a while the top width d1 of the protrusive pattern 210a is wider than the bottom width d2 thereof. The discontinuous film 230 can be formed by the different widths between the top and the bottom of the protrusive pattern 210a. Please refer to FIG. 5B, the patterned bottom layer 210 can be a concave pattern 210b while the top width d1' of the concave pattern 210b is narrower than the bottom width d2' thereof. The discontinuous film 230 can be formed by the different widths between the top and the bottom of the concave pattern 210b.

After the discontinuous film 230 is formed by the shadow mask or the patterned bottom layer, the discontinuous thin film 230 is patterned as shown in FIG. 1C to form a pattern 120. The pattern 120 is a pattern of a gate, a source/drain, a data line, a scan line, a pixel electrode and so on. In an embodiment of the present invention, the discontinuous film 230 can be formed by the conventional photolithography process and the etching process, and so it is not repeated herein.

In brief, the method for forming a pattern of the present invention comprises the steps of forming the discontinuous film and then patterning the discontinuous film to form a pattern of a device. The problems of the uneven stress of the films and the warped substrate can be solved by the discontinuous film. Particularly, the substrate is warped more severely when fabricating the large-sized film. The method for forming the pattern can transform the large-sized continuous film into a plurality of small-sized discontinuous film. Therefore, the problems of uneven stress of the film, the misalignment and the exposure shifting can be solved.

Second Embodiment

The method for forming a pattern of the first embodiment can be applied to the fabrication process of a thin film transistor of the second embodiment. The thin film transistor can be a low temperature poly silicon thin film transistor (LTPS TFT) for example. FIGS. 6A to 6G are schematic, cross-sectional diagrams illustrating the process flow for making a thin film transistor according to a preferred embodiment of the present invention.

Figure 6A:
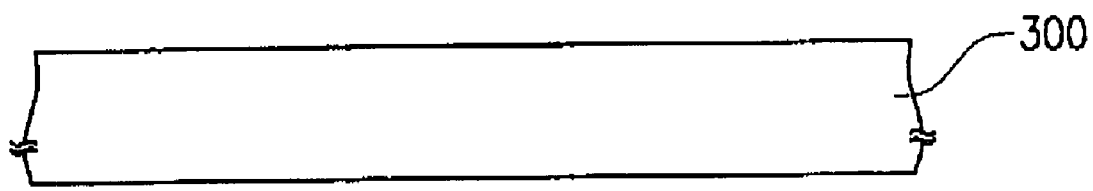
FIGS. 6A to 6G are schematic, cross-sectional diagrams illustrating the process flow for making a thin film transistor according to a preferred embodiment of the present invention.

First, please refer to FIG. 6A, a substrate 300 is provided. The substrate 300 can be a glass substrate, a silicon substrate or a flexible substrate for example.

Figure 6B:
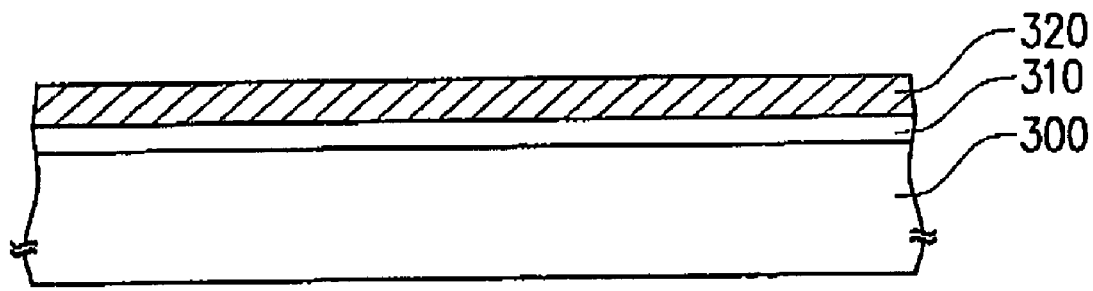
Figure 6C:
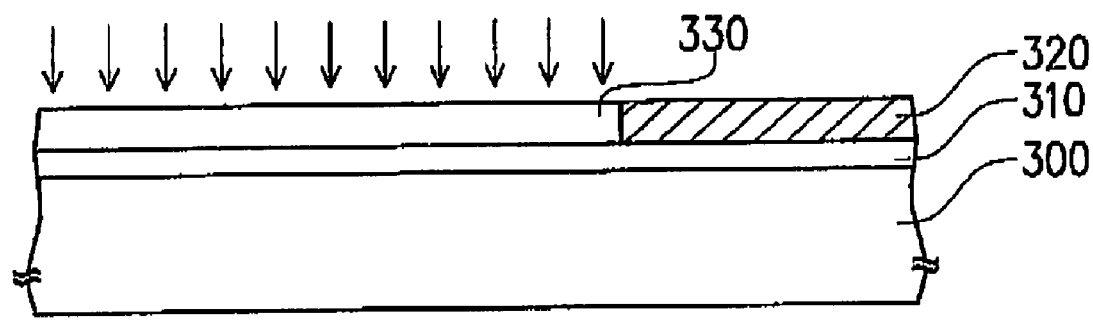
Figure 6D:
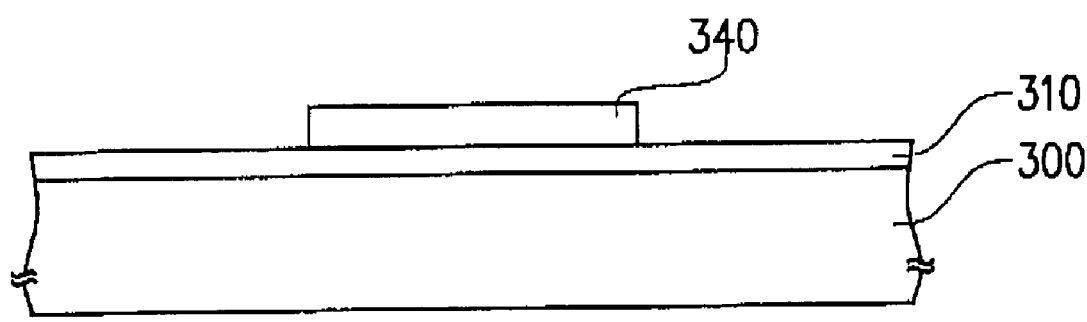

Next, a poly silicon island 340 is formed on the substrate 300 (as shown in FIG. 6D). In an embodiment of the present invention, the method of forming the poly silicon island 340 is shown in FIGS. 6B to 6D for example. Please refer to FIG. 6B, an amorphous silicon layer 320 is formed on the substrate 300 while the amorphous silicon layer 320 is a discontinuous film. Next, please refer to FIG. 6C, an annealing process is performed to make the amorphous silicon layer 320 transform into a poly silicon layer 330. The annealing process can be an excimer laser annealing (ELA) process or a rapid thermal annealing (RTA) process. After that, please refer to FIG. 6D, the poly silicon layer 330 is patterned to form a poly silicon island 340. In an embodiment of the present invention, before the poly silicon island 340 is formed, the method further comprises a step of forming a buffer layer 310 (shown in FIG. 6B) on the substrate 300. The buffer layer 310 is a discontinuous film fabricated by the method for forming the discontinuous film of the first embodiment.

Figure 6E:
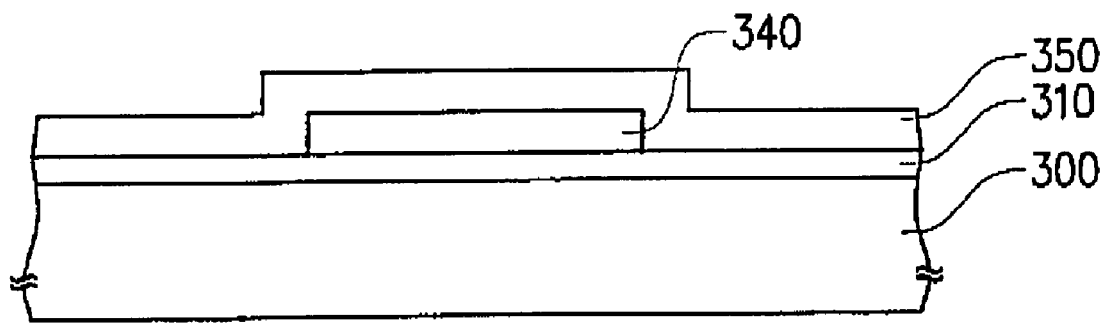

Next, please refer to FIG. 6E, a gate insulating layer 350 is formed to cover the poly silicon island 340. In an embodiment of the present invention, the gate insulating layer 350 is a discontinuous film for example fabricated by the method for forming the discontinuous film of the first embodiment to eliminate the uneven stress of the film.

Figure 6F:
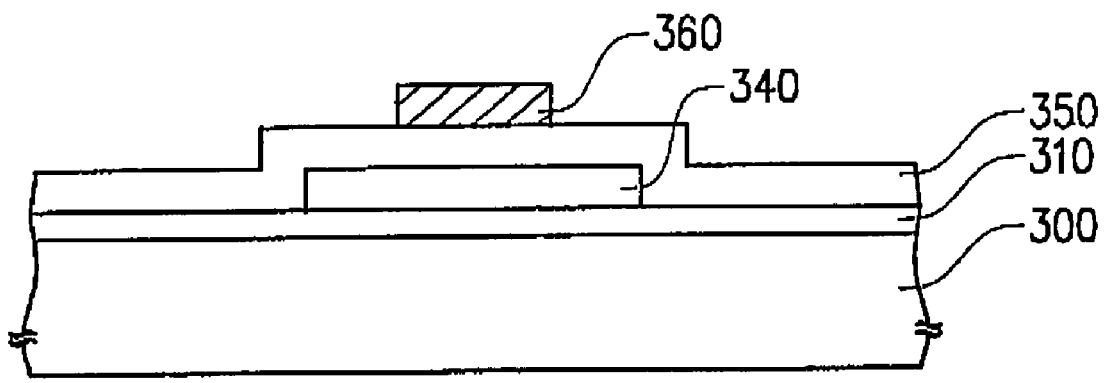
Figure 6G:
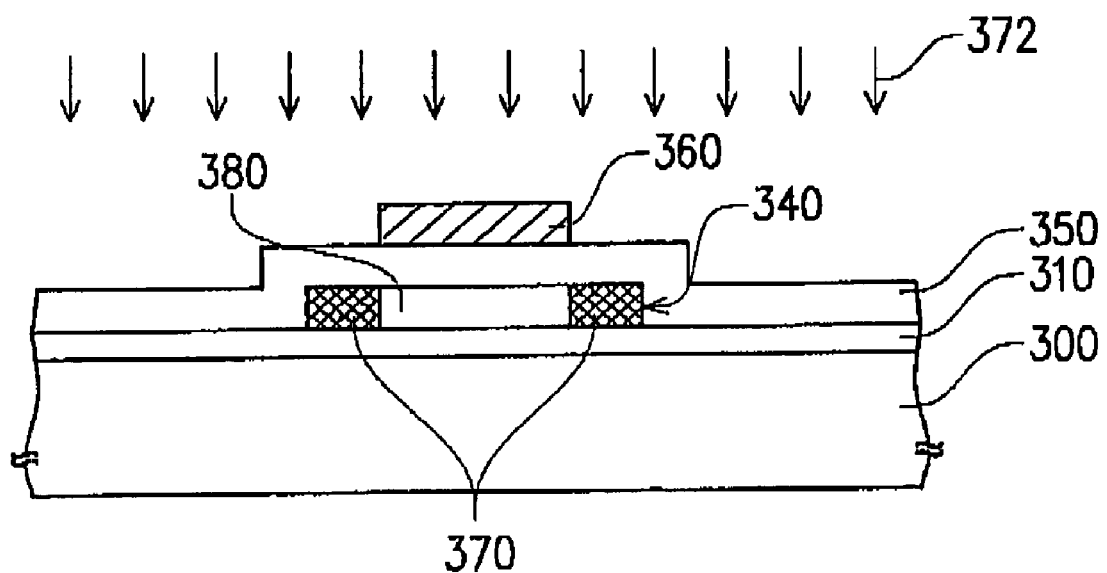

Thereafter, please refer to FIG. 6F, a gate 360 is formed on the gate insulating layer 350. Next, please refer to FIG. 6G, a source/drain 370 is formed in the poly silicon island 340 below one side and the other side of the gate 360 while a channel layer 380 is disposed between the source/drain 370. The source/drain 370 is formed by an ion implantation process using the gate 360 as a self-alignment mask, to form the source/drain 370 at one side and the other side of the poly silicon island 340. After that, an annealing process is performed to repair the lattice structure of the poly silicon island 340.

It should be noted that at least one of the poly silicon island 340 and the gate 360 is formed by using the method for forming a pattern disclosed in the first embodiment. It means that after the discontinuous film serving as the poly silicon island 340 and the gate 360 is formed, the discontinuous film is patterned to form the poly silicon island 340 and the gate 360. Therefore, the uneven stress of the film can be avoided and the yield rate of the thin film transistor can be improved.

Figure 7A:
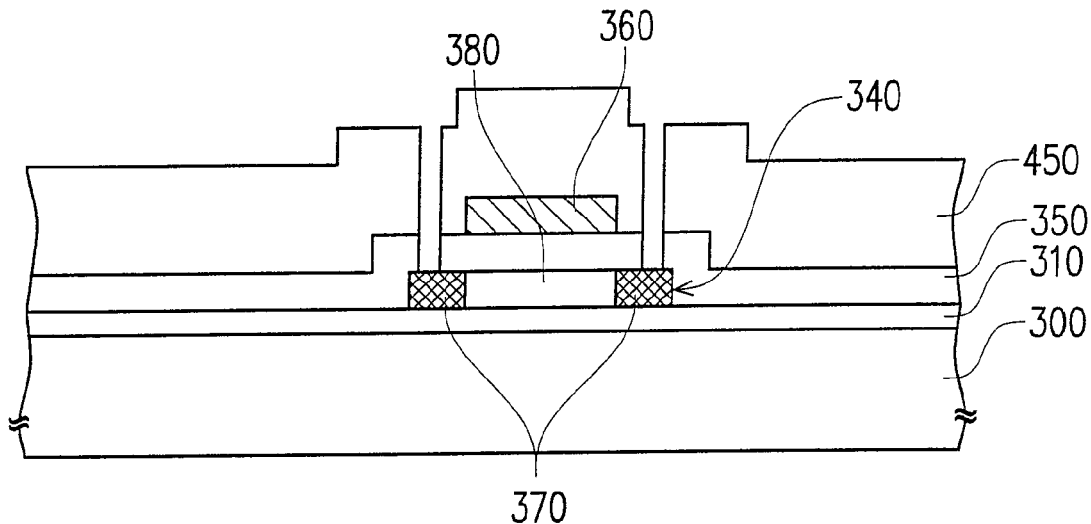
FIGS. 7A to 7C are schematic, cross-sectional diagrams illustrating the step of forming a source/drain according to the method of forming a thin film transistor of the present invention.
Figure 7B:
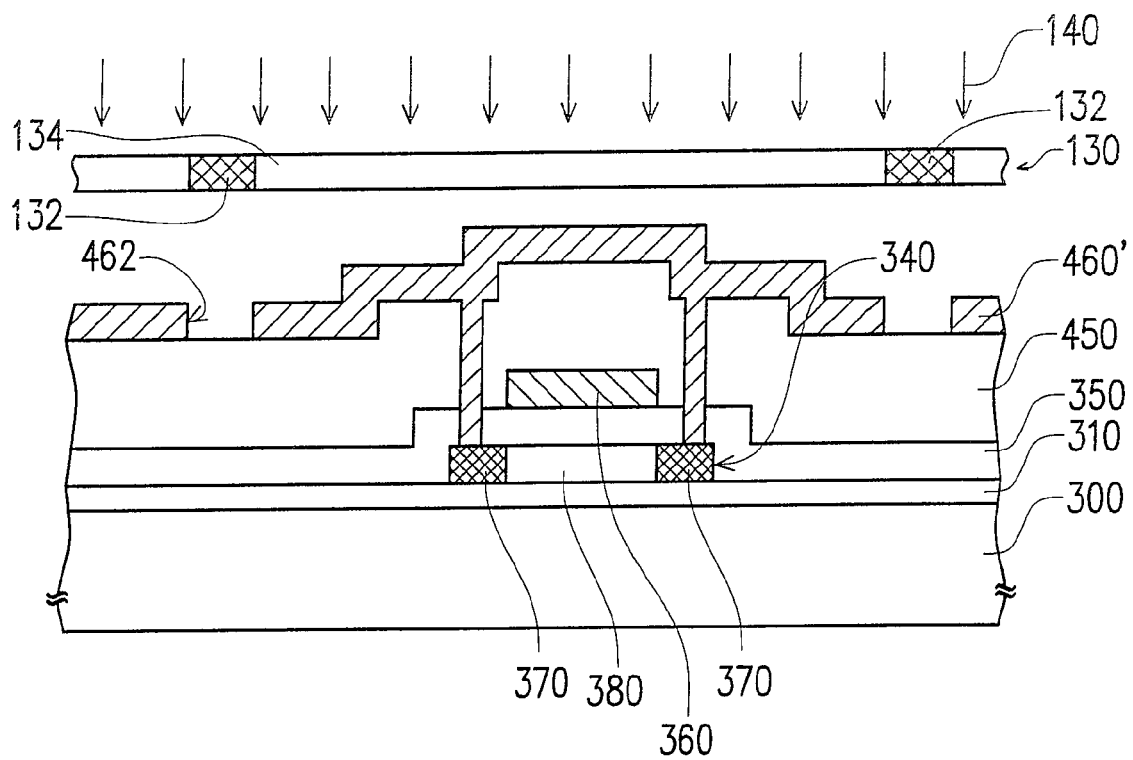

The above mentioned method for forming the thin film transistor may further comprise the step of forming a patterned dielectric layer 450 and a source/drain conducting layer 460 as shown in FIGS. 7A and 7B. First, please refer to FIG. 7A, a patterned dielectric layer 450 exposing a part of the source/drain 370 is formed on the substrate 300. After that, please refer to FIG. 7B, a source/drain conducting layer 460 is formed on the patterned dielectric layer 450 while the source/drain conducting layer 460 is electrically connected to the source/drain 370 respectively. At least one of the patterned dielectric layer 450 and the source/drain conducting layer 460 is formed by using the method for forming a pattern disclosed in the first embodiment.

Figure 7C:
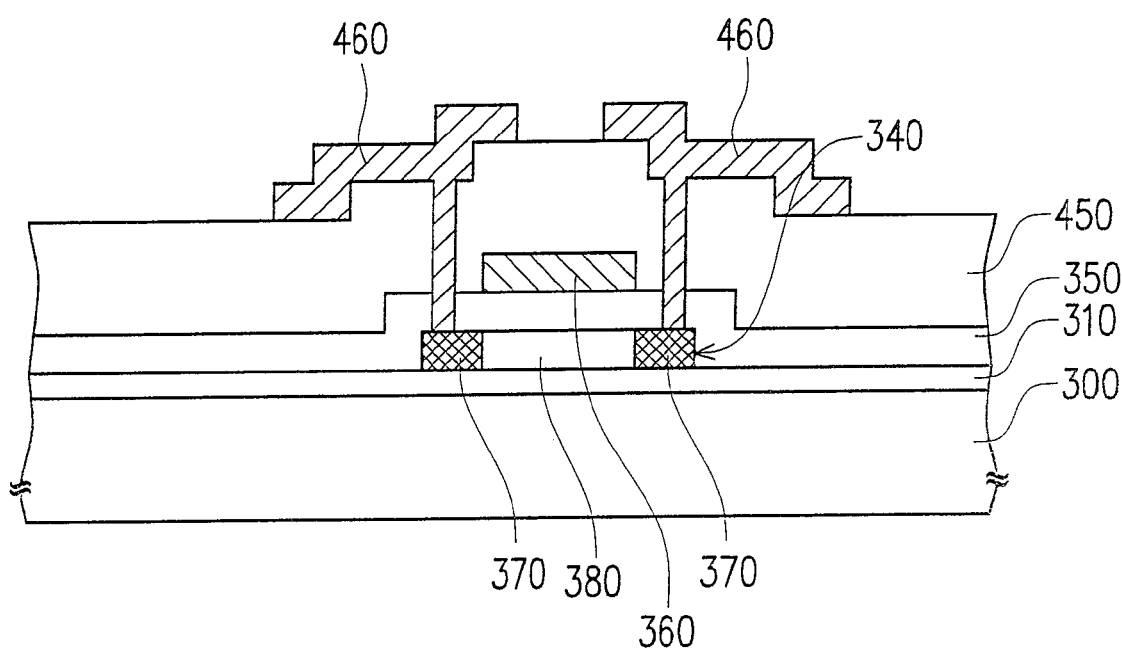

The method for forming the source/drain conducting layer 460 is taken as an example in the following for specifically illustrating that at least one of the patterned dielectric layer 450 and the source/drain conducting layer 460 is formed by using the method for forming a pattern disclosed in the first embodiment. Please continue to refer to FIG. 7B, a second discontinuous film 460' can be formed by the deposition process using the shadow mask as shown in the first embodiment. It means that the second discontinuous film 460' having a discontinuous region 462 can be formed by a deposition process using the shadow mask 130 having the shadow region 132 and the transmissive region 134. Particularly, when fabricating a large-sized film, it can be transformed into a plurality of small-sized film by the discontinuous region 462. Therefore, the problem of uneven stress of the film can be solved, and the uneven stress of the source/drain conducting layer 460 can be eliminated, too. After that, the second discontinuous film 460' is patterned to form the source/drain conducting layer 460 with a predetermined pattern (as shown in FIG. 7C).

Besides, the patterned dielectric layer 450 can be taken as the patterned bottom layer of the first embodiment, to eliminate the uneven stress of the later formed source/drain conducting layer 460. The fabrication process of the patterned dielectric layer is shown in FIGS. 8A to 8F.

Figure 8A:
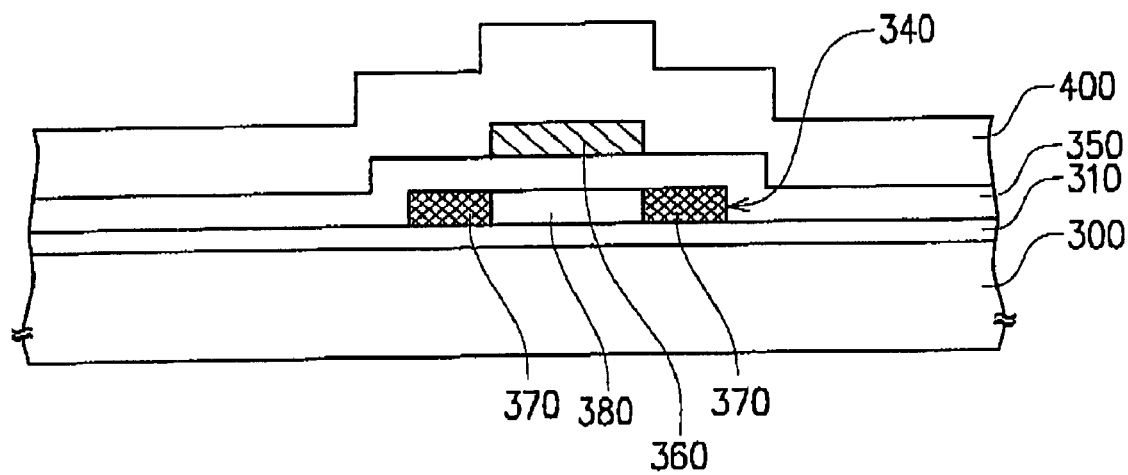
FIGS. 8A to 8F are schematic, cross-sectional diagrams illustrating the step of forming a patterned dielectric layer according to the method of forming a thin film transistor of the present invention.
Figure 8B:
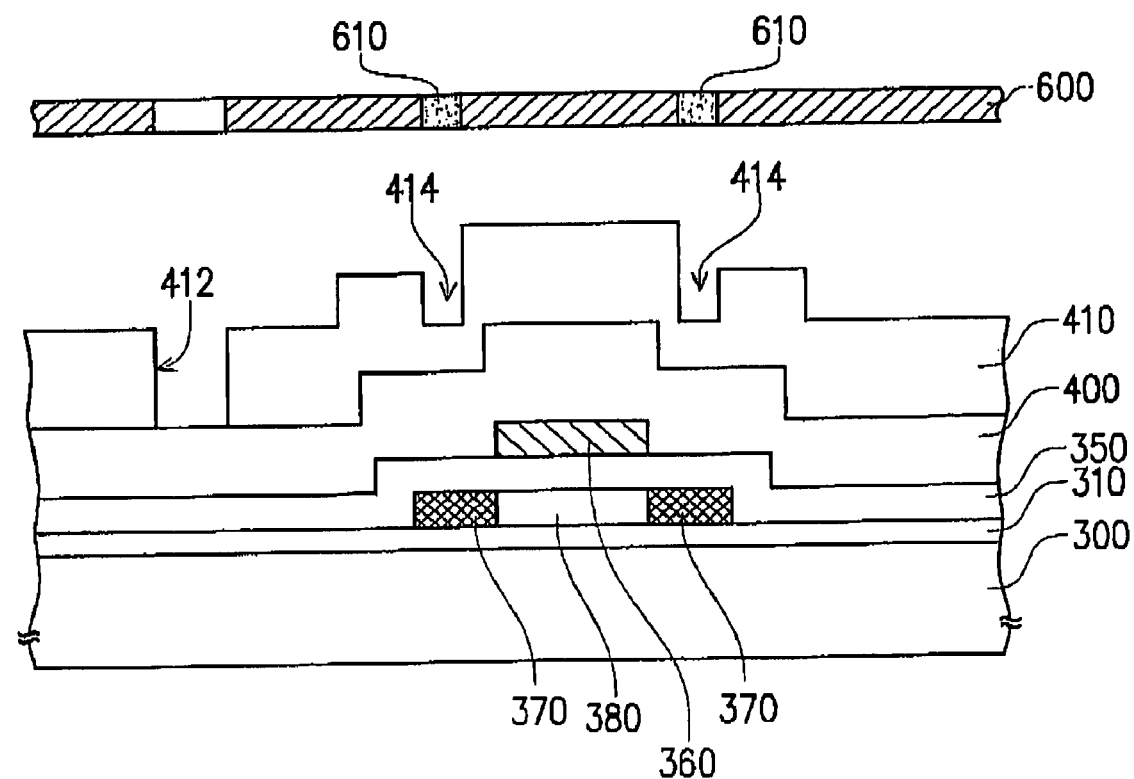

First, please refer to FIG. 8A, a dielectric layer 400 is formed on the substrate 300 to cover the gate 360 and the gate insulating layer 350. Next, please refer to FIG. 8B, a patterned photoresist layer 410 having a first aperture 412 and a second aperture 414 is formed on the dielectric layer 400. The photoresist disposed in the first aperture 412 is totally removed to expose the dielectric layer 400 while a part of the photoresist disposed in the second aperture 414 is removed. In an embodiment of the present invention, the patterned photoresist layer 410 is formed by exposing a photoresist layer with a mask 600 having a half-tone pattern 610. The half-tone pattern 610 is located above the second aperture 414.

Figure 8C:
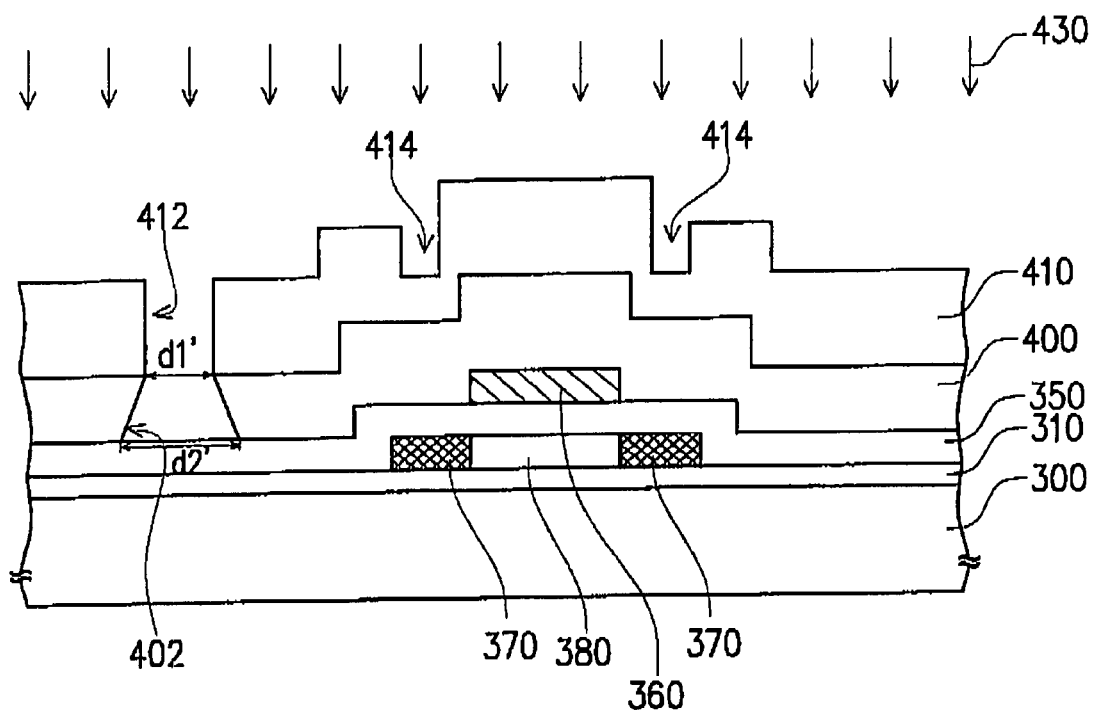
Figure 8D:
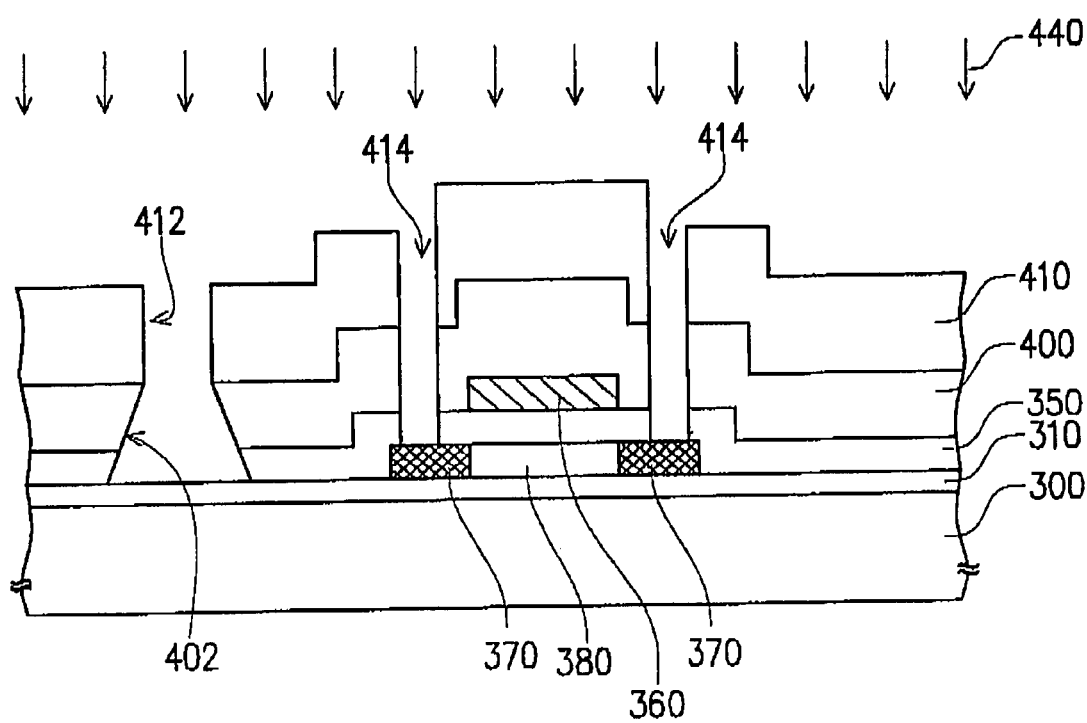

After that, please refer to FIG. 8C, a first etching process 430 is performed to remove the dielectric layer 400 under the first aperture 412 and form a concave pattern 402 in the dielectric layer 400. It should be noted that the top width d1' of the concave pattern 402 is narrower than the bottom width d2' thereof. Next, please refer to FIG. 8D, a second etching process 440 is performed to remove the dielectric layer 400 and the gate insulating layer 350 under the second aperture 414, such that the source/drain 370 is exposed and the gate insulating layer 350 under the first aperture 412 is removed to form the patterned dielectric layer 450 shown in FIG. 8E. In an embodiment of the present invention, before the second etching process 440 is performed, the method further comprises an ashing process to make the second aperture 414 expose the dielectric layer 400. Thereafter, please refer to FIG. 8E, the patterned photoresist layer 410 is removed.

Figure 8E:
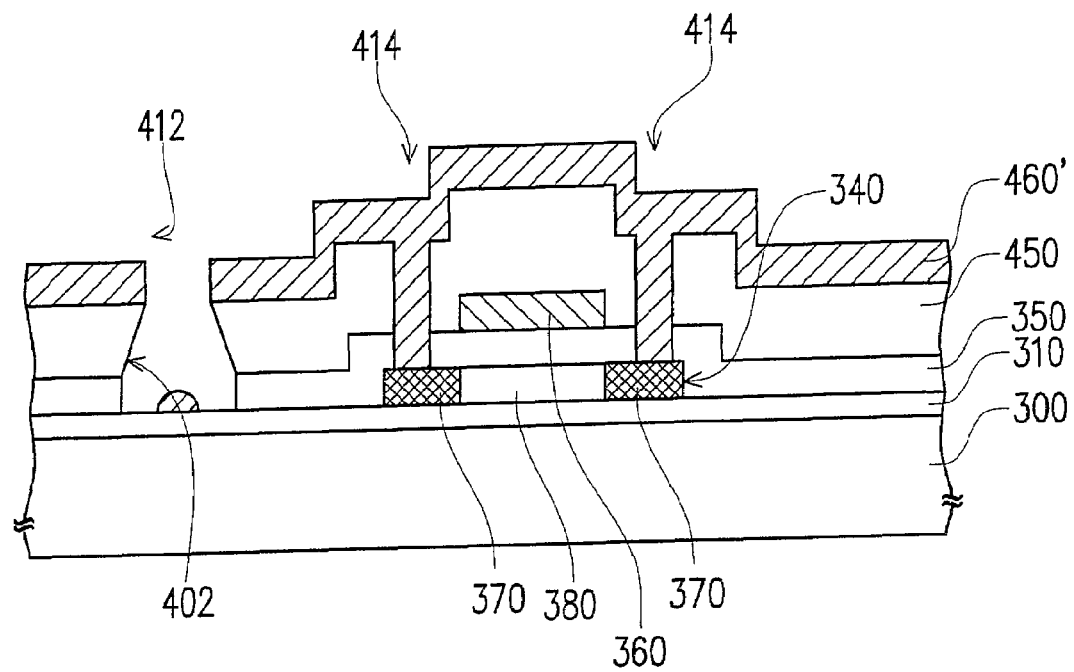
Figure 8F:
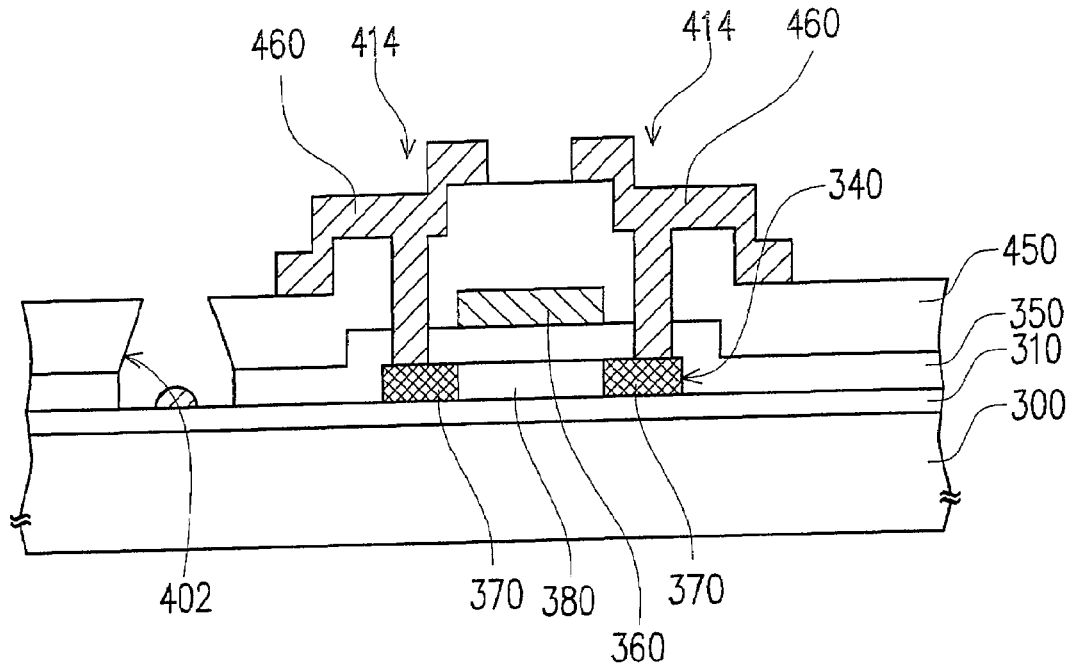

Please continue to refer to FIG. 8E, a second discontinuous film 460' is formed on the substrate 300 while the second discontinuous film 460' is disconnected at the position of the concave pattern 402. Therefore, the problem of the uneven stress of the second discontinuous film 460' 460 can be solved. After that, the second discontinuous film 460' is patterned to form a source/drain conducting layer 460 with a predetermined pattern (as shown in FIG. 8F).

In summary, the thin film transistor disclosed in the second embodiment is formed by using said method for forming a pattern disclosed in the first embodiment, to solve the problem of uneven stress of the film and improve the fabrication yield rate of the thin film transistor.

Third Embodiment

FIGS. 9A to 9E are schematic, cross-sectional diagrams illustrating the process flow for forming a thin film transistor according to another embodiment of the present invention.

Figure 9A:
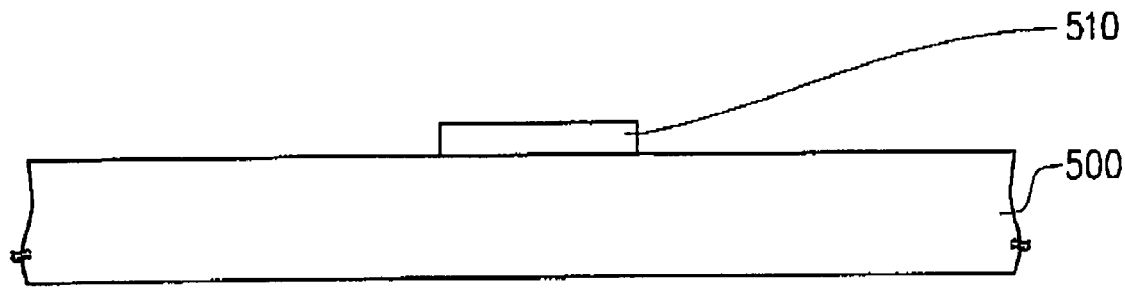
FIGS. 9A to 9E are schematic, cross-sectional diagrams illustrating the process flow for forming a thin film transistor according to another embodiment of the present invention.
Figure 9B:
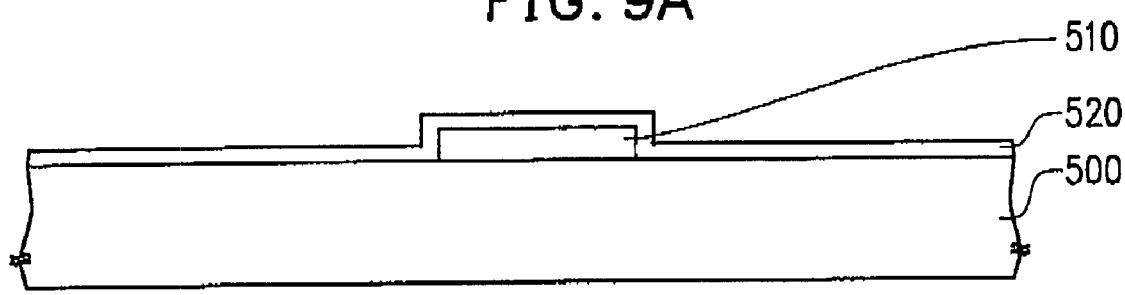

First, please refer to FIG. 9A, a gate 510 is formed on a substrate 500. Next, please refer to FIG. 9B, a gate insulating layer 520 is formed on the substrate 500 to cover the gate 510. After that, please refer to FIG. 9C, a channel layer 530 is formed on the gate insulating layer 520 and the gate 510. Thereafter, please refer to FIG. 9D, a source/drain 550 is formed on the channel layer 530. At least one of the gate 510, the channel layer 530 and the source/drain 550 is formed by using the method for forming a pattern disclosed in the first embodiment.

Figure 9C:
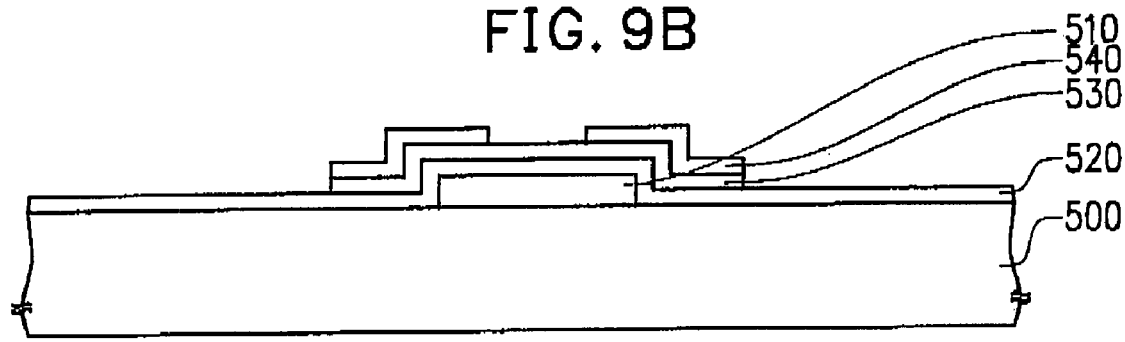
Figure 9D:
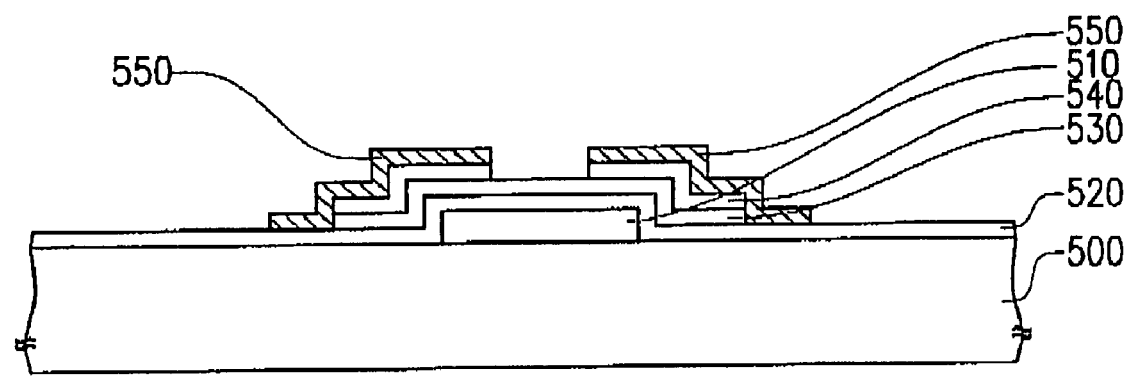

Next, please refer to FIG. 9C, in an embodiment of the present invention, before the source/drain 550 is formed, the method further comprises a step of forming an ohmic contact layer 540 on the channel layer 530 for example. The ohmic contact layer 540 can be formed by using the method for forming a pattern disclosed in the first embodiment. Besides, the gate insulating layer 520 can be a discontinuous film formed by using the method for forming a pattern disclosed in the first embodiment.

Figure 9E:
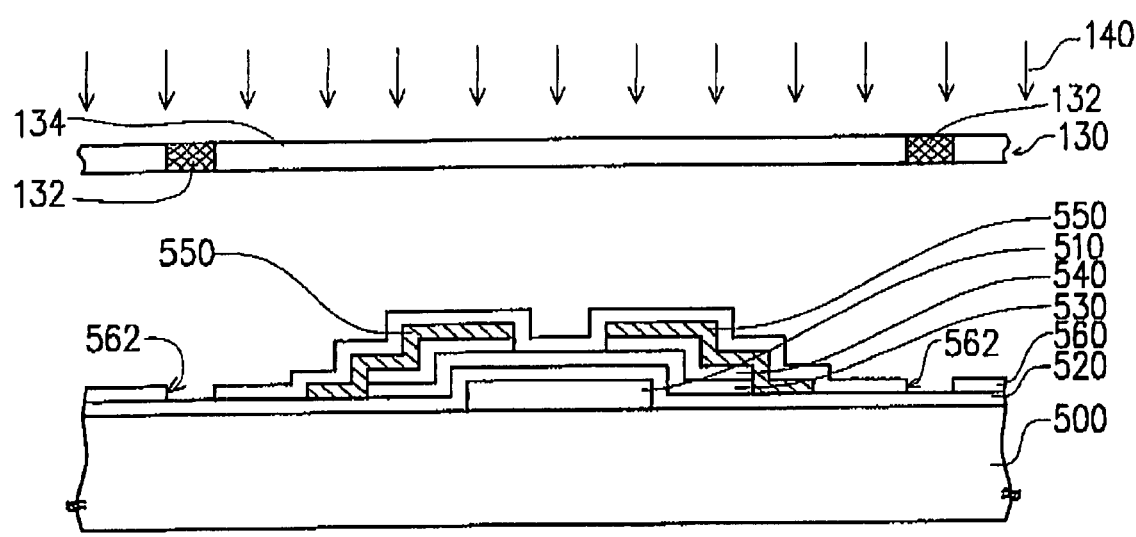

Please refer to FIG. 9E, after the source/drain 550 is formed, a passivation layer 560 is formed to cover the source/drain 550 while the passivation layer 560 can be formed by using the method for forming a pattern disclosed in the first embodiment. As shown in FIG. 9E, the passivation layer 560 can be formed by the deposition process using the shadow mask as shown in the first embodiment, to make the continuous passivation layer 560 transform into a discontinuous layer. The continuous passivation layer 560 is divided into a plurality of blocks by a discontinuous region 562, and therefore the problem of the uneven stress of the passivation layer 560 can be solved. After that, the discontinuous passivation layer 560 can be patterned to form a desired pattern. Of course, the discontinuous passivation layer 560 can be formed by using the method for forming a pattern disclosed in the first embodiment and it is not repeated herein.

In light of the above, each pattern of the thin film transistor can be formed by using the method for forming a pattern disclosed in the first embodiment in order to form a discontinuous film, such that the problem of uneven stress of the film call be solved. Besides, the invention can avoid the substrate from being warped due to the uneven stress and further eliminate the problem of shifting and misalignment during the photolithography process. Therefore, the fabrication yield rate of the thin film transistor can be improved.

In summary, the method for forming a pattern and a thin film transistor of the present invention have the following advantages:

(1) The discontinuous film formed by using the method for forming a pattern disclosed in the present invention is capable of avoiding the substrate from being warped due to the uneven stress. Particularly, the invention can lower the stress of the film efficiently under the condition of a large-sized film.

(2) The thin film transistor formed by using the method for forming a pattern has the discontinuous film with evener stress. Therefore, the invention can avoid the substrate from being warped due to the uneven stress and further eliminate the problem of shifting and misalignment during the photolithography process. Further, the fabrication yield rate of the thin film transistor can be improved.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a thin film transistor, comprising:
providing a substrate;
forming a poly silicon island on the substrate;
forming a gate insulating layer to cover the poly silicon island, wherein the gate insulating layer is a discontinuous film;
forming a gate on the gate insulating layer;
forming a source/drain in the poly silicon island below one side and the other side of the gate, wherein a channel layer is formed between the source/drain, wherein a method for forming at least one of the poly silicon island and the gate comprises:
  forming a discontinuous film on the substrate to reduce the stress of the film; and
  patterning the discontinuous film to form at least one of the poly silicon island and the gate;
forming a patterned dielectric layer on the substrate, wherein the patterned dielectric layer exposes a part of the source/drain, wherein the step of forming the patterned dielectric layer comprises:
  forming a dielectric layer on the substrate to cover the gate and the gate insulating layer;
  forming a patterned photoresist layer having a first aperture and a second aperture on the dielectric layer;
  performing a first etching process to remove the dielectric layer under the first aperture in order to form a concave pattern in the dielectric layer;
  performing a second etching process to remove the dielectric layer and the gate insulating layer under the second aperture in order to expose the source/drain and remove the gate insulating layer under the first aperture simultaneously; and
  removing the patterned photoresist layer;
forming a source/drain conducting layer on the patterned dielectric layer, wherein the source/drain conducting layer is electrically connected to the source/drain respectively, wherein a method for forming the source/drain conducting layer comprises:
  forming a second discontinuous film on the patterned dielectric layer to reduce the stress of the film; and
  patterning the second discontinuous film to form the source/drain conducting layer.

2. The method for forming a thin film transistor according to claim 1, wherein the method for forming the patterned photoresist layer comprises performing an exposure process by using a half-tone mask.

3. The method for forming a thin film transistor according to claim 1, wherein before the second etching process is performed, the method further comprises an ashing process to make the second aperture expose the dielectric layer.

4. The method for forming a thin film transistor according to claim 1, wherein before the poly silicon island is formed, the method further comprises a step of forming a buffer layer on the substrate, and the buffer layer is a discontinuous film.

5. The method for forming a thin film transistor according to claim 1, wherein the step of forming the poly silicon island comprises:
  forming an amorphous silicon layer on the substrate, wherein the amorphous silicon layer is a discontinuous film;
  performing an annealing process to make the amorphous silicon layer transform into a poly silicon layer; and
  patterning the poly silicon layer to form the poly silicon island.

* * * * *